US006855647B2

(12) United States Patent
Beck et al.

(10) Patent No.: US 6,855,647 B2
(45) Date of Patent: Feb. 15, 2005

(54) CUSTOM ELECTRODES FOR MOLECULAR MEMORY AND LOGIC DEVICES

(75) Inventors: Patricia A. Beck, Palo Alto, CA (US); Douglas Ohlberg, Mountain View, CA (US); Duncan Stewart, Menlo Park, CA (US); Zhiyong Li, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/405,294

(22) Filed: Apr. 2, 2003

(65) Prior Publication Data

US 2004/0195688 A1 Oct. 7, 2004

(51) Int. Cl.[7] ............................................... H01L 21/26
(52) U.S. Cl. ...................... 438/795; 438/798; 438/474; 438/513; 438/691
(58) Field of Search ................................ 438/652, 658, 438/660, 659, 676, 686, 650, 661–663, 9, 466, 474, 513, 691, 795, 798; 427/457, 532–534

(56) References Cited

U.S. PATENT DOCUMENTS

| 5,232,747 | A | * | 8/1993 | Evans, Jr. .................... 427/539 |
| 5,990,559 | A | * | 11/1999 | Marsh ......................... 257/768 |
| 6,025,205 | A | * | 2/2000 | Park et al. ....................... 438/3 |
| 6,054,331 | A | * | 4/2000 | Woo et al. ....................... 438/3 |
| 6,078,072 | A | * | 6/2000 | Okudaira et al. ............ 257/295 |
| 6,128,214 | A | | 10/2000 | Kuekes et al. |
| 6,187,682 | B1 | * | 2/2001 | Denning et al. ............. 438/694 |
| 6,214,661 | B1 | * | 4/2001 | Lee et al. .................... 438/240 |
| 6,308,405 | B1 | * | 10/2001 | Takamatsu et al. ........... 29/830 |
| 6,312,567 | B1 | * | 11/2001 | Lee et al. ............... 204/192.15 |
| 6,314,019 | B1 | | 11/2001 | Kuekes et al. |
| 6,395,148 | B1 | * | 5/2002 | Whitman ................ 204/192.15 |
| 6,458,621 | B1 | | 10/2002 | Beck |
| 6,459,095 | B1 | | 10/2002 | Heath et al. |
| 6,498,097 | B1 | * | 12/2002 | Park et al. ................... 438/686 |
| 6,613,699 | B2 | * | 9/2003 | Banba et al. ................ 438/780 |
| 2004/0002205 | A1 | * | 1/2004 | Chen et al. .................. 438/597 |

OTHER PUBLICATIONS

C.P. Collier, et al., "Electronically Configurable Molecular–Based Logic Gates," SCIENCE, vol. 285, Jul. 16, 1999, pp. 391–393.

C.P. Collier, et al., "A [2] Catenane–Based Solid State Electronically Reconfigurable Switch," SCIENCE, vol. 289, Aug. 18, 2000, pp. 1172–1175.

M.A. Reed, et al., "Conductance of a Molecular Junction," SCIENCE, vol. 278, Oct. 10, 1997, pp. 252–254.

J. Chen, et al., "Large On–Off Ratios and Negative Differential Resistance in a Molecular Electronic Device," SCIENCE, vol. 286, Nov. 19, 1999, pp. 1550–1551.

* cited by examiner

*Primary Examiner*—Long Pham
*Assistant Examiner*—Thao X. Le (57) ABSTRACT

A method is provided for fabricating molecular electronic devices comprising at least a bottom electrode and a molecular switch film on the bottom electrode. The method includes forming the bottom electrode by a process including: cleaning portions of the substrate where the bottom electrode is to be deposited; pre-sputtering the portions; depositing a conductive layer on at least the portions; and cleaning the top surface of the conductive layer. Advantageously, the conductive electrode properties include: low or controlled oxide formation (or possibly passivated), high melting point, high bulk modulus, and low diffusion. Smooth deposited film surfaces are compatible with Langmuir-Blodgett molecular film deposition. Tailored surfaces are further useful for SAM deposition. The metallic nature gives high conductivity connection to molecules. Barrier layers may be added to the device stack, i.e., $Al_2O_3$ over the conductive layer.

25 Claims, 2 Drawing Sheets

CUSTOM ELECTRODES FOR MOLECULAR MEMORY AND LOGIC DEVICES

CROSS-REFERENCE TO RELATED APPLICATIONS

The present application is related to U.S. Pat. No. 6,459,095, issued Oct. 1, 2002, entitled "Chemically Synthesized and Assembled Electronic Devices", which is directed to the formation of nanowires used for nanoscale computing and memory circuits. The present application is also related to U.S. Pat. No. 6,314,019, issued Nov. 6, 2001, entitled "Molecular Wire Crossbar Interconnect (MWCI) for Signal Routing and Communications", and to U.S. Pat. No. 6,128,214, entitled "Molecular Wire Crossbar Memory", issued on Oct. 3, 2000, as well as to applications Ser. No. 09/280,045, entitled "Molecular Wire Crossbar Logic (MWCL)", and Ser. No. 09/280,188, entitled "Molecular Wire Transistor (MWT)", both filed on Mar. 29, 1999, which are all directed to various aspects of memory and logic circuits utilized in nanocomputing. Application Ser. No. 09/280,188 was subsequently abandoned in favor of two divisional applications, Ser. Nos. 09/699,080 and 09/699,269, both filed on Oct. 2, 2000; the latter application has issued as U.S. Pat. No. 6,559,468 on May 6, 2003. The present application is also related to application Ser. No. 09/823,195, filed Mar. 29, 2001, entitled "Bistable Molecular Mechanical Devices with a Band Gap Change Activated by an Electric Field for Electronic Switching, Gating, and Memory Applications", and to U.S. Pat. No. 6,458,621, entitled "Batch Fabricated Molecular Electronic Devices with Cost-Effective Lithographic Electrodes", issued on Oct. 1, 2002. The foregoing items are all incorporated herein by reference.

TECHNICAL FIELD

The present application is generally directed to nanoscale computing and memory circuits, and, more particularly, to the formation of wires and contacts for device applications, specifically, to the fabrication of electrodes employed in such devices The term "nanoscale" reflects that either the horizontal or vertical dimensions or the electrical pathway between electrodes is measured in nanometers.

BACKGROUND ART

As feature sizes of integrated-circuit devices continue to decrease, it becomes increasingly difficult to design well-behaved devices. The fabrication is also becoming increasingly difficult and expensive. In addition, the number of electrons either accessed or utilized within a device is decreasing, which produces increased statistical fluctuations in the electrical properties. In the limit, device operation depends on a single electron, and traditional device concepts must change.

Molecular electronics has the potential to augment or even replace conventional devices with electronic elements, can be altered by externally applied voltages, and has the potential to scale from micron-size dimensions to nanometer-scale dimensions with little change in the device concept. The molecular switching elements can be formed by solution techniques; see, e.g., C. P. Collier et al, "Electronically Configurable Molecular-Based Logic Gates", Science, Vol. 285, pp. 391–394 (16 Jul. 1999) ("Collier I") and C. P. Collier et al, "A [2]Catenane-Based Solid State Electronically Reconfigurable Switch", Science, Vol. 289, pp. 1172–1175 (18 Aug. 2000) ("Collier II"). The self-assembled switching elements may be integrated on top of a semiconductor integrated circuit so that they can be driven by conventional semiconductor electronics in the underlying substrate. To address the switching elements, interconnections or wires are used.

For nanoscale electronic circuits, it is necessary to invent new materials with the functions envisioned for them and new processes to fabricate them. Nanoscale molecules with special functions can be used as basic elements for nanoscale computing and memory applications.

While self-assembled techniques may be employed and while redox reaction-based molecules may be used, such as rotaxanes, pseudorotaxanes, and catenanes, other techniques for assembling the devices and other molecular systems may alternatively be employed. An example of such other techniques comprises lithographic techniques adapted to feature sizes in the micrometer-size range, as well as feature sizes in the nanometer-size range. An example of other molecular systems involves electric-field-induced band gap changes, such as disclosed and claimed in patent application Ser. No. 09/823,195, filed Mar. 29, 2001, which is incorporated herein by reference. While prior references have employed the term "band gap", this term more precisely is used for semiconductors. The corresponding term with regard to molecules is "HOMO-LUMO gap" (highest occupied molecular orbital—lowest unoccupied molecular orbital), and that is the term that will be used throughout.

Examples of molecules used in the electric-field-induced HOMO-LUMO gap change approach include molecules that evidence:

(1) molecular conformation change or an isomerization;
(2) change of extended conjugation via chemical bonding change to change the HOMO-LUMO gap; or
(3) molecular folding or stretching.

Changing of extended conjugation via chemical bonding change to change the HOMO-LUMO gap may be accomplished in one of the following ways:

(a) charge separation or recombination accompanied by increasing or decreasing HOMO-LUMO localization; or
(b) change of extended conjugation via charge separation or recombination and n-bond breaking or formation.

Molecular electronic devices hold promise for future electronic and computational devices. Examples of such molecular electronic devices include, but are not limited to, crossed wires, nanoporous surfaces, and tip addressable circuitry which forms switches, diodes, resistors, transducers, transistors, and other active components. For instance, a crossed wire switch may comprise two wires, or two electrodes, for example, with a molecular switching species between the two electrodes. Thin single or multiple molecular layers can be formed, for example, by Langmuir-Blodgett (LB) techniques or self-assembled monolayer (SAM) on a specific site. Well-controlled properties, such as roughness and hydrophilicity of the underlying surface are needed to allow optimal LB film formation.

Prior work in the field of molecular electronics has utilized electrodes of gold (Reed et al, Science, Vol. 278, pp. 252–254 (1997); Chen et al, Science, Vol. 286, pp. 1550–1551 (1999)), aluminum (Collier I, supra), and polysilicon (Collier II, supra).

Gold has a low melting point, low bulk modulus, and high diffusivity, making it less stable with respect to external stress and incompatible with a standard CMOS process, although it has the advantages of no oxide and the chemical stability of a noble metal. Aluminum forms a poorly controlled native oxide that acts as a natural barrier to electronic transport. Polysilicon is a semiconductor with associated semiconductor properties, giving it lower conductivity than a metal and an oxide barrier to transport. Polysilicon electrode molecular devices have been fabricated and shown to display switching (Collier et al, supra).

Platinum is difficult to maintain in a stable form. During the interval following Pt deposition and preceding the next processing step, an "environmental" film (carbon, etc.) will form on the surface. This is a particular issue when the active molecular layer may be on the order of 20 Å thick, which, for reference, is the same magnitude as a native silicon oxide. Working with a just-deposited-film (perhaps the "cleanest" way) is difficult and impractical. Even a "just-deposited" blanket film will require time to move to the next process, which will not be in ultrahigh vacuum (UHV). Until alternate means of forming patterned contacts are readily realizable, lithography is presently the most likely technology to use. Shadow masks avoid lithographic process, but are dimensionally limited (to large micron-sized dimensions, sparsely placed) Even nanoimprinting exposes surfaces to organic chemicals that are potentially incompatible with the use of organic active layers. Therefore, the most practical way to fabricate electrodes incorporating molecules is to pattern the electrode with a flexible geometry in a cost-efficient, time efficient, flexible geometry way and then clean the organics from the surface before subsequent processing Thus, a method for preparing platinum, and other conductive electrodes, that avoid most, if not all, of the foregoing problems is required for use with molecular films for forming molecular electronic devices. In addition, it would be an advantage to tailor the surface to desired device specifications for use even if lithographic steps are not employed.

DISCLOSURE OF INVENTION

In accordance with the embodiments disclosed herein, a method is provided for tailoring the surface of a conductive layer to provide a smooth surface that can be as smooth as the surface of the underlying substrate supporting the conductive layer. By "conductive layer" is meant a layer comprising a material having a resistivity of less than 1375 micro-ohm-cm, wherein the material is capable of forming a solid-state oxide that is stable under ambient conditions. The method includes (a) depositing the conductive layer on the substrate; and
(b) tailoring at least portions of the top surface of the conductive layer in a plasma to at least smooth the top surface of the conductive layer, whereby the surface roughness is essentially the same as that of the substrate.

The terms "tailored" or "tailoring" refer to a process involving the preparation of the surface preference, and further includes any of the following: (a) actively smoothing, (b) actively oxidizing, which produces a very hydrophilic surface good for Langmuir-Blodgett films, (c) actively removing the oxide without re-roughening, and (d) actively passivating. By "actively" is meant that an operation is performed or a sequence of predetermined steps is set in motion to accomplish a specific desired result.

In accordance with another embodiment, a method of fabricating a molecular electronic device comprising at least a bottom electrode and a molecular switch film thereon is provided. The method comprises:

(a) providing a substrate;
(b) forming the bottom electrode on the substrate, the bottom electrode comprising a tailored conductive material; and (c) forming the molecular film on at least the bottom electrode, wherein the bottom electrode is formed by a process including:

(b1) cleaning portions of the substrate where the bottom electrode is to be deposited;
(b2) pre-sputtering the portions; and
(b3) depositing the conductive layer on at least the portions.

In yet another embodiment, after the conductive layer is deposited, then the properties of the top surface of the conductive layer are tailored.

In a still further embodiment, a conductive layer having a smooth surface is provided, wherein the conductive layer essentially replicates the smooth surface of the underlying substrate.

In some embodiments, a contact or top electrode is formed over the bottom electrode, which may be oriented at a non-zero angle with respect thereto, such as with a crossbar device, e.g., a switch. For pores, dots, tip addressing, etc., there may be an electrode or alternatively brief contact may be made, such as with a dot.

Following the last step (depositing the conductive layer or the tailoring step), the molecule or molecular film is formed on the surface.

In accordance with a further embodiment, a method is provided for forming a conductive layer on a substrate having a first surface roughness, with the conductive layer having a second surface roughness, where the second roughness is approximately the same as the first surface roughness. The method comprises the steps (b1) to (b3) enumerated above, optionally with the tailoring step.

Advantageously, conductive electrode properties include: a controlled oxide formation (under certain circumstances), a high melting point, high bulk modulus, low diffusion, some degree of stability (which depends on surface preparation). Smooth deposited film surfaces are compatible with Langmuir-Blodgett molecular film deposition. The metallic nature gives high conductivity connection to molecules. Barrier layers may be added to the device stack, i.e., $Al_2O_3$ over the conductive layer.

The embodiments disclosed and claimed herein, while including the deposition of the conductive layer, are not to be construed as limiting to just the deposition, but optionally includes the tailoring of the conductive surface through plasma exposure. Such tailoring of the conductive surface is apparently unknown heretofore. Essentially, the physical structure is combined with chemical features to produce films uniquely suited for the application of molecular films through a wide variety of formats, including, but not limited to, Langmuir-Blodgett (LB), self-assembled monolayer (SAM), spin-coat, etc.

The surface may be further tailored to include oxide or no oxide while maintaining the low surface roughness, which also changes the wetting properties, etc.

BEST MODES FOR CARRYING OUT THE INVENTION

Definitions

As used herein, the term "self-aligned" as applied to "junction" means that the junction that forms the switch and/or other electrical connection between two electrodes is created wherever portions of the two electrodes, either of which may be coated or functionalized, overlap.

The term "device" means a switch, diode, resistor, transducer, transistor, or other electrical element formed with two or more electrodes.

The term "self-assembled" as used herein refers to a system that naturally adopts some regular pattern because of the identity of the components of the system; the system achieves at least a local minimum in its energy by adopting this configuration.

The term "singly configurable" means that a device can change its state only once via an irreversible process such as an oxidation or reduction reaction; such a device can be the basis of a programmable read-only memory (PROM), for example.

The term "reconfigurable" means that a device can change its state multiple times via a reversible process such as an oxidation or reduction; in other words, the device can be opened and closed multiple times, such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

"Micron-scale dimensions" refers to dimensions that range from 1 micrometer to a few micrometers in size.

"Sub-micron scale dimensions" refers to dimensions that range from 1 micrometer down to 0.05 micrometers.

"Nanometer scale dimensions" refers to dimensions that range from 0.1 nanometers to 50 nanometers (0.05 micrometers).

"Micron-scale wires" refers to rod or ribbon-shaped conductors or semiconductors with widths or diameters having the dimensions of 1 to 10 micrometers or larger, heights that can range from a few tens of nanometers to a few micrometers, and lengths of up to several micrometers or more.

"Nanometer-scale wires" refers to rod or ribbon-shaped conductors or semiconductors with widths or diameters having the dimension of 1 to 50 nanometers, heights that can range from 0.3 to 100 nm, and lengths of up to several micrometers or more.

Molecular Devices

Figure 1A:
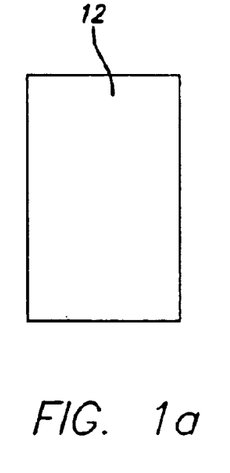
FIGS. 1a–1d are top plan views of one embodiment of a process for fabricating molecular devices (the embodiment depicted is of a crossed wire device, but the embodiments herein are not so limited)
Figure 1B:
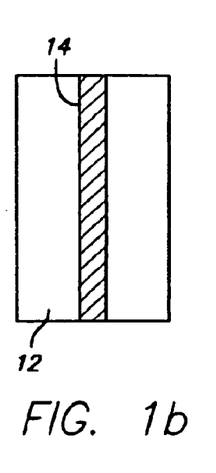
Figure 1C:
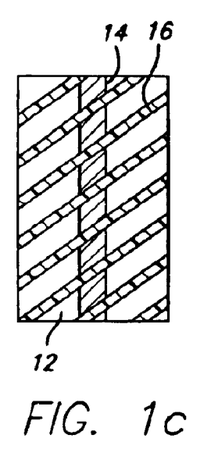
Figure 1D:
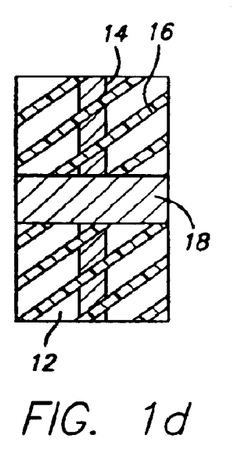

FIGS. 1a–1d depict one embodiment for the fabrication of molecular devices 10. As shown in FIG. 1a, a substrate 12 is provided. Next, a bottom electrode 14 is formed on a portion of the top surface of the substrate 12, as shown in FIG. 1b. A molecular switch film 16 is formed on the surface of the substrate 12, covering the bottom electrode 14. Finally, a top electrode 18, generally at right angle to the bottom electrode 14, is applied on the molecular film 16. The completed molecular device 10 is shown in FIG. 2.

Figure 2:
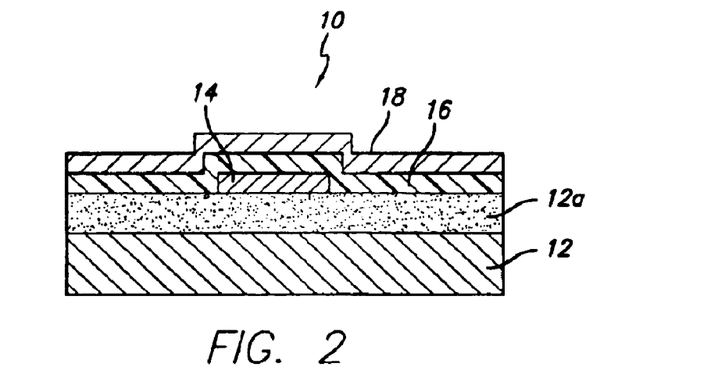
FIG. 2 is a cross-sectional view (side elevation) taken through the lines 2—2 of FIG. 1d.

Further details of the formation of a molecular device 10, such as shown in FIG. 2, are available in above-mentioned U.S. Pat. No. 6,458,621. Briefly, the substrate 12 comprises a material selected from the group consisting of semiconductors, insulating plastics, polymers, crystalline ceramics, and amorphous ceramics. Preferably, the substrate 12 includes a coating 12a formed thereon, such as an insulating layer formed on a semiconductor wafer, such as $SiO_2$ on Si.

The bottom electrode 14 comprises a material selected from the group consisting of platinum, tungsten, aluminum, polycrystalline silicon, single crystal silicon, amorphous silicon, and conductive polymers.

The molecular film 16 typically comprises a material capable of switching/changing in the presence of an applied electric field. One example includes molecular materials based on oxidation/reduction mechanisms, such as rotaxanes, pseudo-rotaxanes, and catenanes.

Another example of the molecule film 16 includes molecular materials that evidence an electric field induced HOMO-LUMO (highest occupied molecular orbital-lowest unoccupied molecular orbital) gap change and are selected from the group consisting of: (1) molecular conformation change or an isomerization; (2) change of extended conjugation via chemical bonding change to change the HOMO-LUMO gap; and (3) molecular folding or stretching, wherein the change of extended conjugation via chemical bonding change to change the HOMO-LUMO gap is selected from the group consisting of: (2a) charge separation or recombination accompanied by increasing or decreasing electron localization; and (2b) change of extended conjugation via charge separation or recombination and π-bond breaking or formation.

As noted above, such switch films 16, which are primarily discussed in terms of switches, may also be used in a variety of devices, including, but not limited to, diodes, resistors, transducers, transistors, etc.

The top electrode 18 is selected from the same list of materials as the bottom electrode 14, and may be the same or different, with the caveat that there is usually, but not always, a sticking layer (e.g., Ti). Such a sticking layer may account for some of the switching activity, i.e., it may be the difference between the Pt and Ti that is involved in the switching and so the choice of electrode may well tailor the effect. Also, the top electrode may not even be part of the stack, but rather part of a. moveable- tip addressable scheme.

Specific examples of top contacts 18 further include circular electrodes and nanopores over the molecular film 16 covered with an electrode. The nanopore serves to limit the extent of the top contact.

Present Embodiments

The embodiments herein are directed to the improved fabrication of conductive electrodes, e.g., platinum (Pt), electrodes for use in molecular electronic devices 10, particularly bottom electrodes 14. This material has been fabricated as the lower electrode 14 in a device stack 10 as shown in FIG. 2. The platinum electrodes 14 have been tested with 2-station [2] rotaxane molecular film and eicosanoic acid film 16. These molecular devices 10 have displayed both diode behavior and switch behavior. However, while the following description is specifically directed to platinum electrodes, the electrode may comprise any conductive material that forms a solid oxide film that is stable under ambient conditions (e.g., standard temperature and pressure—STP). Advantageously, the conductive electrode properties include: low or controlled oxide formation (or possibly passivated), high melting point, high bulk modulus, and low diffusion. Further, the conductive material forming the bottom electrode 14 has a resistivity less than 1375 micro-ohm-cm, and may comprise any of the elements in rows 1B–7B and 8 of the Periodic Table. Examples include platinum, tungsten, silver, aluminum, copper, nickel, chromium, molybdenum, titanium, and tantalum. Of these, platinum is preferred because it is compatible with CMOS-type back-end processing and packaging, i.e., oxide/nitride films and high temperature steps.

The deposition of platinum lower electrodes 14 employing prior art procedures results in metal layers having a smoothness of 8 to 10 Å (the smoothness of the coating 12a is typically about 4 Å). It is noted that prior deposition techniques that use a typical sticking layer increase the roughness.

Unless the adhesion is carefully controlled, Pt deposited in any useful thickness simply lifts from the surface, especially under liquid conditions such as SAM or LB deposition. Also prior depositions make no mention of tailoring the surface; the Pt is just deposited. Herein, the surface is tailored for smoothness, hydrophilicity and barrier layer.

Figure 3:
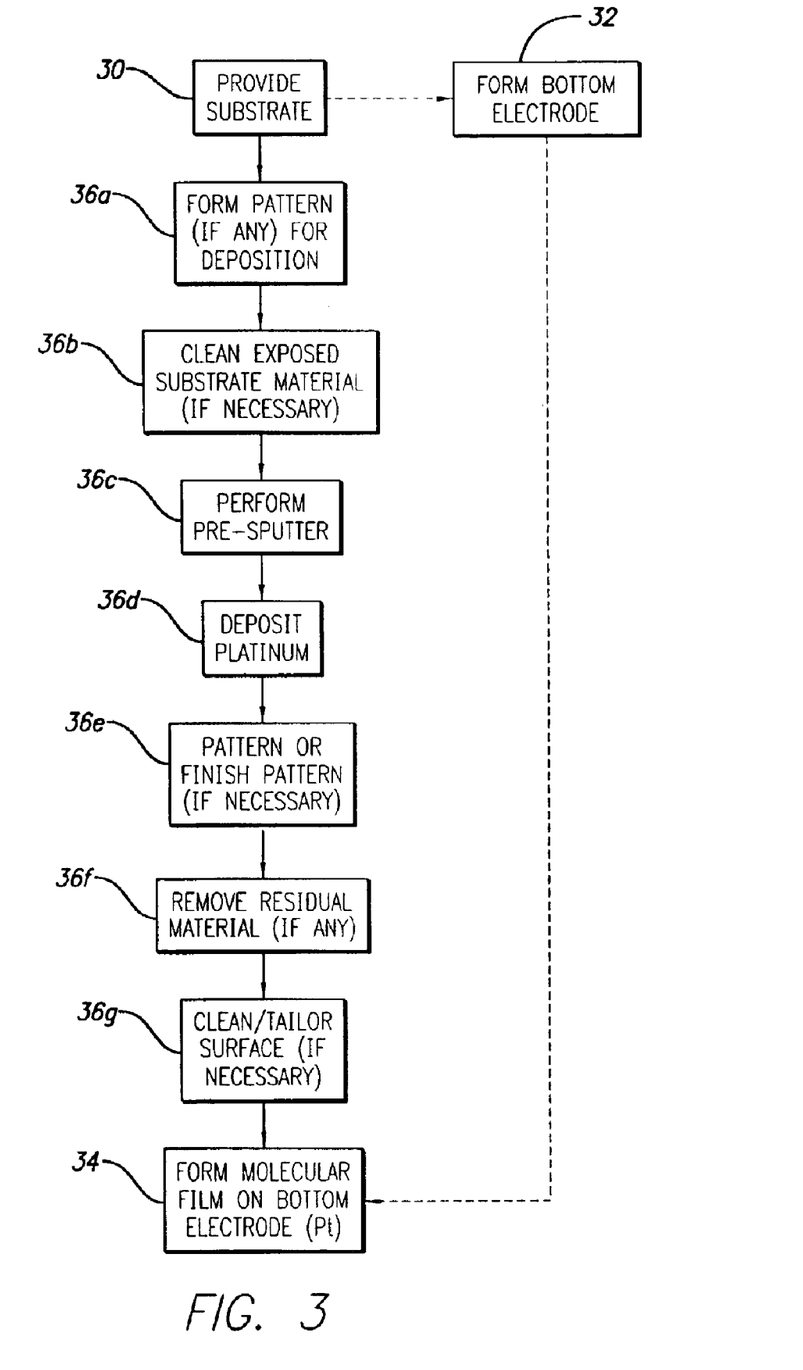
FIG. 3 is a flow chart depicting the process.

The following description of the formation of the bottom electrode 14 on a coated substrate 12, 12a is intended to be exemplary only. FIG. 3 illustrates the flow chart for the process disclosed herein.

The substrate 12 is provided (step 30). In the prior art approach, the bottom electrode 14 is formed on the substrate (step 32). Next, the molecular film 16 is formed on the bottom electrode (step 34). In accordance with the embodiments disclosed herein, a pattern (if any) is formed for deposition (step 36a), exposed portions of the substrate 12 are cleaned, if necessary (step 36b), those portions are pre-sputtered (step 36c), the Pt bottom electrode 14 is deposited on those portions (step 36d), the pattern is finished, if necessary (step 36e), residual material, if any, is removed (step 36f), and the properties of the top surface of the Pt electrode 14 are cleaned/tailored (step 36g). Following tailoring of the top surface properties, the molecular film 16 is deposited on the Pt electrode 14. The details of the process are now described.

The substrate 12 comprises <100> SEMI-grade prime silicon wafer (alternatively, an extra smooth substrate, such as cleaved mica, may be used). If a silicon wafer is used, it is cleaned as is conventional in the semiconductor art for a pre-diffusion clean such as an RCA-clean.

Next, a layer of tight knit, or dense, thermal oxide 12a is grown on the silicon wafer 12 (or deposited on a non-silicon wafer). If non-thermal oxide is deposited, it will most likely require densification. If a non-silicon substrate, such as mica, is used, then the oxide may not be needed, as the substrate may not be electrically conducting. As is well-known, tight-knit thermal oxide is grown to be close-packed, thereby avoiding a separate densification step that would increase the process time.

An oxide, or other suitable material as is known in the art, is needed on silicon to provide an insulating substrate 12a, and thereby electrically isolate the subsequent platinum layer from silicon 12. Otherwise, a metal on semiconductor would result, and device properties would be more coupled to the substrate, which is less desirable than metal on insulator. Direct contact may also produce metal-silicon intermixing. If an insulating non-silicon crystal 12, such as mica, is used, then the insulating layer 12a is superfluous and can be eliminated, as noted above.

The thermal oxide 12a is grown to a preferable thickness of about 2,000 Å. The layer could be thicker than 2,000 Å, but must not be so thick that undue stress on the wafer 12 or in the film develops. On the other hand, the thickness of the thermal oxide 12a should be greater than 1,000 Å for electrical isolation.

A silicon nitride, $Si_xN_y$, where x=1–3 and y=1–4 (stoichiometric $Si_xN_y$ is $Si_3N_4$), could be grown in place of silica, but is less preferable, due to the lack of stoichiometric control that is obtainable with $SiO_2$.

If desired, a resist is formed and patterned for conventional lift-off (step 36a). Any of the resist materials commonly employed in this art may be used. The pattern is the array of one or more bottom electrodes 14. The resist is removed from those areas where the platinum is to be deposited to form the bottom electrodes. Removal of the resist is also conventional. A dry etch of the metal would produced a somewhat sharper profile, which is not necessarily desirable where molecular coverage on the order of 30 Å is attempted. Indeed, etching (wet/dry/milling, etc.) techniques may be done, although they may involve multiple steps for fabricating desired profiles. Another method of producing a pattern to be filled with platinum would be the well known shadow-masking process.

Once the areas for Pt deposition have been exposed, these open areas are cleaned (descummed), such as with an oxygen plasma (step 36b). The specific parameters for de-scumming depend on the particular plasma system used; for an RIE System 1700, the conditions were 100 mTorr, 100 Watts, for 2 minutes, using forward power control. The time may range from 1 to 5 minutes, but no further significant improvement is seen after 5 minutes. More sputtering, which is undesirable, results from higher power. Pressures in the range of 50 to 200 mtorr and powers up to 100 Watts have been used.

Next, a pre-sputter of the exposed areas is performed (step 36c). A 5 min. argon (Ar) pre-sputter was performed in an SFI DC Magnetron sputter system at 6.5 sccm Ar, 0.9 mTorr. This pre-sputter further cleans the surface (the above $O_2$ plasma removes organics) and removes environmental contaminants. Without this pre-sputter step, the subsequent Pt layer 14 lifts off under duress, while too much sputtering increases the surface roughness of the substrate coating 12a.

The advantage of the pre-sputter step is that no "sticking" layer, or adhesive layer, is required, as is conventional practice in the art, in order to deposit the platinum layer 14 and maintain it on the surface of the substrate 12 or coating 12a. This avoids the extra steps required and potential increased surface roughness resulting from the deposition of these layers(s) otherwise required, e.g., Ti, Cr, Ta, conventionally used to adhere a platinum layer to a surface.

However, experiments were performed to provide adequate sticking without sacrificing smoothness. Further, for films immersed in liquid, it is not always apparent that the layer is going to peel when dry. For LB coating and SAM deposition, the Pt film must be well adhered. Some deposited Pt films, which seem to be adequately adhered without the process disclosed herein, simply roll up like a window shade when the substrate is immersed in fluid.

In a preferred embodiment, the platinum layer 14 is blanket-deposited everywhere, using, for example, a DC magnetron sputtering system (step 36d). As an example of operating parameters, present sample values for cleaned and reconfigured system are: cathode: 6.7 A, 6.7 V; beam: 15 mA, 348 V; accelerator 1.3 mA, 150.5 V; neutralizer: 5.61 Å; emission: 16.8 mA to deposit a layer of Pt about 1,000 Å thick. The Pt layer 14 can be thinner or thicker than 1,000 Å, but must be thick enough to provide good conduction, but not so thick as to provide a large step for the molecular switch film 16 to cover. By "good" conduction is meant that the platinum layer 14 can pass a desired current through a probe. The thickness of the Pt layer 14 is in the range of 50 to 5,000 Å, No lumps/asperities of platinum were observed on the surface from this system for a thickness of 1,000 Å. A desired profile without sharp edges is achieved through lift-off techniques. Fine line liftoff is achieved with thinner depositions, without undue experimentation. While liftoff is preferred, shadow-masking and etching may alternatively be performed.

In the preferred embodiment, the formation of the Pt layer 14 is completed by performing the lift-off, to remove resist(s) (and the metal covering that resist) from unwanted regions (step 36e). A conventional solvent, such as N-methyl-pyrrolidone, followed by a water rinse, may be used. Again, combinations of techniques well known in the semiconductor art, though not as preferred, may be used. If no pre-patterning was done, then at this step, the blanket platinum would be masked and etched, again, using techniques well known in the art.

Platinum may alternatively be deposited by evaporation, such as e-beam evaporation, also blanketly deposited.

The remaining Pt bottom conductor areas 14 are cleaned, which again is system-dependent (step 36f). If there is resist remaining from a previous step, this step serves to remove any residual material. The removal of such residual material could be as restrained as the cleaning/tailoring step described immediately below. Alternatively, depending on the quality and quantity of residual material, the removal step could be much more aggressive, using various combinations of plasma etching, wet or dry etching, etc.

In the preferred embodiment, step 36f is omitted, and an $O_2$ plasma is used to clean, as well as rearrange and smooth the surface of the remaining Pt layer 14 (step 36g). An example of such $O_2$ cleaning/tailoring is performed in an RIE System 1700; the conditions were 80 sccm $O_2$, 100 mTorr, 100 Watts, for 5 minutes, operating under forward power control with a HIVAC base pressure of $2.0 \times 10^{-5}$ Torr. It appears that the surface is physically distinct, based on Atomic Force Microscopy images. It appears that the oxygen plasma is sufficient to cause some physical bombardment of the surface. At lower powers with higher pressures, no rearrangement of the surface is observed.

Essentially, at relatively low pressure and high power (not too much gas in the chamber, physical bombardment), there is a sputtering component that increases with the mass of the species. On the other hand, at relatively high pressure, low power (lots of gas; less acceleration), then mostly a chemical reaction occurs. Under the conditions of moderate pressure and power is where the desired rearrangement is obtained. As with the foregoing processes, this step is machine-dependent, and the operating parameters will vary from one machine to another. However, the determination of such operating parameters for a specific machine is not considered to be undue, based on the teachings herein.

The tailoring step is performed in an oxygen plasma to rearrange the platinum layer and to smooth the top surface of the platinum layer. This step alters the hydrophilicity of the Pt layer to render it more hydrophilic and also provides a barrier layer (due to the presence of the $PtO_2$ on the surface). This is important, since the Pt surface is very hydrophilic when the oxide is present and seems to be the key to obtaining a desirable uniform Langmuir-Blodgett film.

An oxygen plasma, as described in the previous paragraph, provides a hydrophilic Pt surface. Use of an oxygen plasma and a subsequent argon plasma may alternatively be used; this combination provides a less hydrophilic, more hydrophobic Pt surface. Yet alternatively, an argon plasma alone may be used, which also provides a hydrophobic surface. Finally, a sequence of oxygen, then hydrogen plasmas may be used, to provide a smooth surface with reduced oxygen, which is passivated.

The foregoing Pt deposition procedure yields a surface roughness that is less than 8 Å RMS, and can be as small as 4 Å RMS which is about as good as the substrate coating 12a. It also yields at this point an oxygenated surface and a hydrophilic surface.

Without subscribing to any particular theory, it appears that the reason why a smooth platinum surface is obtained is based on the following: (1) prior to the platinum deposition, the process starts with smooth surface, with smooth oxide thereon (or cleaved insulator, such as mica); (2) no sticking layer is used for adhesion of the Pt layer (sticking layers, such as Ti, Cr, Ta, increase the surface roughness); and (3) subsequent to Pt deposition, the $O_2$ plasma removes any remaining polymer, rearranges and smoothes the surface, without pitting it, thereby tailoring the Pt top surface. It will be appreciated that the $O_2$ plasma also rearranges and smoothes even when no polymer (the resist) contact is initiated.

The oxygenated layer may be removed in an argon plasma in the same RIE machine, either immediately following or at a later time. The conditions of 40 mTorr, Ar (80 sccm), and 15 W forward power remove the oxygenated layer, maintain the smoothness of the rearranged surface, (without re-roughening), and produce a surface which wets identically to "as-deposited" platinum, with only trace amounts of oxide present.

EXAMPLES

Experimental Procedure

Both the blanket and photolithographically-modified Pt films were sputter deposited on Si wafers with a 100 nm silicon dioxide layer. The typical Pt thickness was 100 nm. The plasma treatment was performed in a RIE® model 1700 system. Freshly deposited Pt films and films exposed to various plasma treatments were analyzed with contact angle and ellipsometry measurements within 10 minutes of preparation and by XPS and Auger with controls.

For contact angle measurements a droplet of 2 µL 18 MΩ·cm water was injected onto the sample surface from a syringe. An image of the static water droplet was recorded with a digital camera and analyzed to yield a sessile contact angle, averaging at least three readings.

Ellipsometric measurements were performed using a laser with a wavelength of 532 nm and an incident angle of 58 degrees. A simple model was used to derive the optical constants, n and k. The platinum was approximated by an infinite thickness. The reported values represent an average of three readings from different locations.

The surface morphology of the Pt films was monitored with a commercial atomic force microscope operated under ambient conditions in tapping mode. The surface roughness is calculated over a 1 µm² area.

XPS spectra were acquired on either a Surface Science Instruments spectrometer or a PHI Quantum 2000 spectrometer with monochromated Al Kα 1486.6 eV X-ray source. Take-off angles in the two instruments were set at 35° and 45°, respectively. All the photoemission peak positions were corrected to opportunistic C1s at 284.8 eV binding energy.

Auger analysis was performed on a PHI 670 Scanning Auger Microprobe with a CMA analyzer, 20 KeV, 10 nA beam energy and 45 degree tilt.

Results and Discussions

A. Optical Constants

Previous ellipsometric study has shown that the optical constants of Pt thin films were strongly dependent on the film deposition conditions. In this study, the optical constants, refractive index (n) and extinction coefficient (k), of films with different plasma treatments were derived from single-wavelength ellipsometry with a single-layer model. The films with different plasma treatments fell into two classes based on their optical constants measured at 532 nm: a larger value class with n ~2.5 and k ~4.2 and a smaller value class with n~1.8 and k ~3.4. The films treated with argon plasma and those treated with argon after oxygen behaved similarly to the as-deposited film. They all exhibited larger optical constants. In contrast, measurements of the platinum films exposed only to oxygen plasma resulted in optical parameters belonging to the smaller values class. Films intentionally introduced to photochemicals before plasma treatment showed no variation from the above.

Although there was only a slight decrease of the n and k values over several hours, contact angle measurements exhibited a larger change. Ellipsometry appears not to be sensitive to the changes that do occur.

B. Contact Angle Measurement

Water contact angle is a direct measure of surface hydrophilicity. Sessile water contact angles of the Pt thin films were recorded in parallel with the optical constants. Under ambient conditions, contact angles increased markedly within in the first three hours, changing slowly thereafter. As a catalytic material, a variety of chemical species can adsorb onto platinum surfaces. As the surface adsorbs CO, hydrocarbons, and other organic compounds, the surface free energy decreases and a higher water contact angle is observed. Contact angle studies by other investigators also have documented a hydrophilic nature migrating toward hydrophobic within minutes of exposure to the laboratory atmosphere. Hydrophobic is defined as a contact angle greater than degrees.

The platinum films could also be divided into two classes, based upon the time dependence of the water contact angle. The samples in the higher contact angle group consisted of: the fresh as-deposited film and films treated with an argon plasma. The samples exhibiting values in the lower contact angle group were the films treated with an oxygen plasma (and no subsequent argon plasma). This is consistent with the ellipsometric measurements.

Both measurements reveal that an oxygen plasma treatment changes some platinum thin film properties, while an argon plasma treatment can restore some properties of freshly deposited Pt films. The oxygen plasma treated surfaces are initially more hydrophilic than the freshly deposited or argon plasma treated surfaces, but the rate of increase of the contact angle is similar for both classes. In order to understand why and how the oxygen plasma treatment can change surface properties so dramatically, x-ray photoelectron spectroscopy was utilized to examine the surface chemical composition of the platinum thin films.

C. X-Ray Photoelectron Spectroscopy (XPS) and Auger Electron Spectroscopy (Auger)

The survey and Pt 4f region spectra of four platinum thin films were scanned. The four films were (1) a fresh as-deposited thin film, (2) a film treated with argon plasma (5 min. at 100 W and 100 mTorr; "AR1") alone, (3) a film treated with only oxygen plasma (5 min. at 100 W and 100 mTorr; "OX1"), and (4) a film treated with oxygen plasma (5 min. at 100 W and 100 mTorr) followed by argon (5 min. at 100 W and 100 mTorr) plasma. Only Pt, C, and O were observed on all samples. The presence of carbon and oxygen was unavoidable because of surface adsorption of hydrocarbons and species with C-O functionalities. The peak position and intensity of C, O, and Pt were almost identical on the fresh as-deposited thin film, the film treated with argon plasma, and the film treated with oxygen plasma plus argon plasma. However, a significant increase of the O 1s peak intensity at 532 eV was observed in the film treated with oxygen plasma alone. In addition, a new set of Pt 4f peaks appeared on this sample at higher binding energy. The new peaks, Pt $4f_{7/2}$ at 74.7 eV and Pt $4f_{5/2}$ at 78.0 eV, are conclusive evidence of platinum oxide formation. This result is also consistent with the XPS result for a previously reported $PtO_2$ thin film prepared by reactive sputtering in the presence of oxygen gas.

Combining all the pieces of information derived from optical constant measurements, contact angle measurement, XPS, and Auger studies, it is clear that the oxygen plasma treatment forms an oxide layer on the Pt thin film surface and changes the surface properties dramatically. In order to understand the relationship between oxide generation and the oxygen plasma condition, high-resolution spectra of platinum thin films treated with a somewhat aggressive oxygen plasma treatment (5 min. at 100 W and 100 mTorr), OX1, and with a less aggressive plasma (2 min at 50 W and 50 mTorr), OX2, were studied. The relative atomic concentrations of all the fitted components are listed in Table 1, after the absolute peak areas were corrected with the sensitivity factor of each element.

TABLE 1

The relative atomic concentration (%) of fitted peaks at different chemical states.

| | Pt 4f peaks | | | O 1s peaks | | |
|---|---|---|---|---|---|---|
| Samples* | 1 + 1' ($Pt^0$) | 2 + 2' (PtO or $Pt(OH)_2$) | 3 + 3' ($PtO_2$) | 1 (metal oxide) | 2 (C—O related) | C 1s peaks |
| OX1 | 6.4 | 4.5 | 17.1 | 32.5 | 19.1 | 20.3 |
| OX2 | 7.9 | 5.1 | 16.7 | 30.7 | 20.2 | 19.9 |
| OX1 + AR2 | 53.9 | 1.0 | 0.1 | 2.7 | 3.6 | 38.6 |
| OX2 + AR2 | 55.1 | 0.8 | 0.0 | 3.1 | 2.2 | 38.8 |

OX1 = $O_2$ plasma: 5 min. 100 W 100 mTorr; OX2 = $O_2$ plasma: 2 min. 50 W 50 mTorr; AR2 = Ar plasma: 1 min. 15 W 40 mTorr.

The majority of the Pt, 56% to 61%, within the XPS sampling depth (usually less than 50 Å) of films treated with oxygen plasma was in the $PtO_2$ chemical state as denoted 3 and 3'. The O to Pt atomic ratio is nearly 2:1, provided that the $Pt^0$ (denoted as 1 and 1') was excluded in these samples. A small portion of Pt, 16% to 17%, was assigned tentatively as PtO or $Pt(OH)_2$ chemical state as denoted 2 and 2'. The more aggressive oxygen plasma produces only slightly more oxide than the less aggressive oxygen plasma, based on the ratio of Pt in oxide chemical states vs. Pt in the metallic state.

Estimation of thickness of platinum oxide from high-resolution XPS spectra was performed using the simple substrate-overlayer model and the thickness of oxide in the Pt film treated with the aggressive and less aggressive oxygen plasmas was calculated to be 2.4 nm and 2.7 nm, respectively. Auger data, which follows, differs with respect to this thickness.

XPS shows about 98% of Pt exists in the metallic chemical state ($Pt^0$) after a further treatment with the AR2 argon plasma. The stated argon plasma condition is the minimal possible power and flow to generate a stable plasma in the RIE instrument. Any platinum oxides were present in quantities below the XPS detection limit. The oxygen atomic concentration dropped to less than 6% among the elements detected on these samples and could be mainly attributed to the surface adsorbed species with C—O functional groups.

A high percentage of C was also detected in these metallic platinum film surfaces from various adsorbed species.

The Auger Electron Spectroscopy results showed similar elements but differed with respect to oxide thickness. The elements detected on the surface of each of the samples were primarily platinum plus carbon and oxygen. By elemental analysis of the etch products, seeking the point at which oxygen from the sample became undetectable during etching, it was concluded that the oxide (PtO, $PtO_2$, $Pt(OH)_2$) was less than 5 Å in thickness (for a sample treated with OX1), actual depth, full width, half maximum (FWHM). The oxygen content of as-deposited and OX1+ AR2 treated samples was minimal and their oxide thicknesses were less than 2 Å.

The ion-gun etch rate was experimentally determined to be 5.2 Å/min (actual depth in Pt(O) by AFM measurement) The calculated conversion factor between the Pt(oxide) etch rate and $SiO_2$ calibration material was consistent with that for other heavy metals. Survey scans of the samples were presented as plots of the first derivative of the number of electrons detected as a function of energy. Depth profiles were obtained by alternating an acquisition cycle with a sputter cycle. During the acquisition cycle selected elemental peak intensities were collected. The sputter cycle removed material from the surface of the sample using a 2 keV $Ar^+$ source rastered over a 5 mm×5 mm area. In order to eliminate crater wall effects, the data was acquired from a much smaller region in the center of the sputtered area.

For a sample subjected to OX1, slight shifts in the platinum peak position due to chemical state allowed the Pt (oxide) and Pt (metal) components of the metal to be separated using a linear least squares (LLS) curve fitting routine. No correction to the relative sensitivity factor was made for the Pt (oxide) trace for stoichiometry and therefore error may be present in the atomic compositions reported.

The $PtO_2$ peaks dominate the OX1 spectrum where ~61% of the Pt is present as $PtO_2$. The remaining Pt is present in two or three different states and in the initial XPS data these states were separated into $Pt^0$ (metal) and $PtO/Pt(OH)_2$. Due to the strong peaks of $PtO_2$ and PtO, the PtO and $Pt(OH)_2$ chemical states could not be accurately separated.

Using the OX1+AR2 treated sample as a reference for spectral subtraction and assuming that this sample is representative of the surface after cleaning and after exposure to air, the reference spectrum of the sample with treatment OX1+AR2 is seen as primarily $Pt^0$ with trace amounts of $PtO/Pt(OH)_2$. Scaling and subtracting the spectrum of the sample treated with OX1+AR2 from that treated with OX1 alone produces the chemical difference between the two samples, i.e., the effect of the oxygen plasma. In this subtracted spectrum, the primary peaks are associated with the presence of $PtO_2$ but minor states are also present. Curve-fitting the spectrum reveals $PtO_2$ and two additional chemical states that correlate to PtO and $Pt(OH)_2$. The data shows an approximately 2 eV difference between these two chemical states, which is corroborated by available literature. The narrowness of the fitted peaks cause some ambiguity as to the precise ratios of these two chemical states, but both are present in the sample treated with OX1.

The ratios of PtO2: $PtO:Pt(OH)_2$ were found to be:

$PtO_2$: 87.4%

PtO: ~5.1%

$Pt(OH)_2$: ~7.5%

In conclusion, the spectral subtraction shows more clearly the difference between samples treated with OX1 alone and OX1+AR2. These differences include the presence of three additional chemical states for platinum: $PtO_2$ (predominantly) and lesser amounts of both PtO and $Pt(OH)_2$.

D. Atomic Force Microscopy (AFM)

Plasma treatment of the platinum thin films also altered the morphology. Investigation was carried out to achieve surfaces with as smooth as possible morphology. The surface roughness was monitored by AFM, and the data is listed in Table 2, along with other surface properties. The sputtering deposition condition used in this laboratory produces platinum thin films with RMS roughness of 5.4 Å over an area of 1 $\mu m^2$.

TABLE 2

The surface properties of platinum thin film treated with different plasma conditions.

| Process condition* | Water Contact angle (degrees) | n | k | RMS roughness in 1 $\mu m^2$ (Å) |
|---|---|---|---|---|
| Fresh as-deposited Pt | 32 | 2.53 | 4.26 | 5.4 |
| 5 min $O_2$ plasma (OX1) alone | w | 1.85 | 3.35 | 3.4 |
| 5 min Ar plasma alone | 30 | 2.47 | 4.18 | 8.1 |
| OX1 + 5 min Ar plasma | 30 | 2.50 | 4.21 | 5.7 |
| OX1 + 3 min Ar plasma | 25 | 2.51 | 4.23 | 6.0 |
| OX1 + 1 min Ar plasma | 25 | 2.45 | 4.15 | 5.6 |
| OX1 + 1 min Ar plasma (50 W, 50 mTorr) | 31 | 2.48 | 4.18 | 4.8 |
| OX1 + 1 min Ar plasma (25 W, 50 mTorr) | 32 | 2.47 | 4.18 | 4.4 |
| OX1 + 1 min Ar plasma (15 W, 40 mTorr) (AR2) | 27 | 2.40 | 4.07 | 3.8 |
| OX1 + 1 min Ar plasma (20 W, 25 mTorr, no plasma is generated) | w | 1.90 | 3.41 | 3.1 |

$O_2$ or Ar plasma: 100 W 100 mTorr, unless otherwise specified. w: water readily wetted the surface producing a contact angle of generally less than 10 degrees, so it was difficult to obtain an accurate reading.

Argon plasma exposure, particularly, "high" power plasma, will roughen the platinum surface. An 8.1 Å RMS roughness was observed for the surface treated with argon plasma for 5 min. at 100 W and 100 mTorr. Heavy argon atoms under a high power plasma condition can bombard the Pt thin film and roughen the surface. Oxygen plasma exposure did not roughen the surface, but rather smoothed it, as suggested by a 3.4 Å roughness over an area of 1 $\mu m^2$ recorded for the surface treated oxygen plasma for 5 min. at 100 W and 100 mTorr.

A series of lower power/shorter duration argon plasmas was evaluated for its ability to minimize the effect of roughening. By using a minimal argon plasma, 1 min. 15 W at 40 mTorr, little roughening (3.8 Å RMS roughness in 1 $\mu m^2$) of the platinum thin film surface occurred, yet the oxide was removed and surface properties dramatically changed.

Conclusion

The properties of platinum thin films are strongly affected by the plasma treatment conditions. Argon-treated Pt thin films behaved similarly to as-deposited untreated films with respect to water contact angle and ellipsometrically measured optical properties. Oxygen plasma treatment resulted in marked change of the surface chemical properties. XPS and Auger studies confirmed the formation of platinum oxides, $PtO_2$, PtO and Pt(OH) after the film was treated with oxygen, even under modest plasma conditions. The change in the surface properties was attributed to the formation of such an oxide layer on the film surface. Further treatment with argon plasma diminished the oxide layer; however, aggressive argon plasmas roughened the surface. In order to minimize the surface roughness, a minimal argon plasma recipe subsequent to oxygen plasma treatment was developed to produce clean, metallic Pt thin films with a roughness of less than 4 Å within a 1 $\mu m^2$ area.

Initial experiments indicate that hydrogen plasma will also remove the oxide and may offer some passivation advantages.

INDUSTRIAL APPLICABILITY

The method of fabricating a platinum layer having a relatively smooth surface and tailored mechanical, physical and chemical properties in a molecular electronic device is expected to find use in nanoscale computing and memory circuits.

What is claimed is:

1. A method for tailoring at least portions of a top surface of a conductive layer formed on a substrate having a first surface roughness to provide said top surface with a second surface roughness, said method including:
   depositing said conductive layer on said substrate; and
   following said depositing, tailoring at least portions of said top surface of said conductive layer in a plasma to at least smooth said top surface of said conductive layer, wherein said plasma is operated at a higher pressure and lower power than sputtering and at a lower and higher power than ashing, whereby said second surface roughness is essentially the same as said first surface roughness.

2. The method of claim 1 wherein said tailoring is performed in a plasma to additionally accomplish at least one of the following: (a) rearrange said conductive layer, (b) after the hydrophilicity of said top layer, and (c) provide a barrier layer due to the presence of an oxide film on said top surface.

3. The method of claim 2 wherein said plasma is selected from the group consisting of oxygen alone to provide a hydrophilic surface, oxygen and subsequent argon to provide a less hydrophilic, more hydrophobic surface, argon alone to provide a hydrophobic surface, or a sequence of oxygen and hydrogen to provide a smooth surface with reduced oxygen, which is passivated.

4. The method of claim 3 wherein said plasma contains oxygen, leaving an oxide film on said conductive layer, and wherein said oxide film is subsequently removed, leaving said smooth top surface of said conductive layer.

5. The method of claim 1 wherein said tailoring includes at least one of the following steps: cleaning and oxidizing to a predetermined level.

6. The method of claim 1 wherein said tailoring includes at least one of the following steps: actively smoothing, actively oxidizing, actively removing said oxide without re-roughening, and actively passivating.

7. The method of claim 1 wherein said conductive material comprises a material selected from Rows 1B–7B and 8 of the Periodic Table.

8. The method of claim 7 wherein said conductive material is selected from the group consisting of platinum, tungsten, silver, aluminum, palladium, copper, nickel, chromium, molybdenum, titanium, and tantalum.

9. The method of claim 8 wherein said conductive material consists essentially of platinum.

10. The method of claim 1 wherein said second surface roughness is less than 8 Å RMS.

11. The method of claim 10 wherein said second surface roughness proximately 4 Å RMS.

12. A method of forming a conductive layer on a substrate having a first surface roughness, said conductive layer having a second surface roughness, where said second surface roughness is approximately the same as said first surface roughness, said method comprising:
   cleaning portions of said substrate where said bottom electrode is to be deposited;
   pre-sputtering said portions;
   depositing said conductive layer on at least said portions without formation of any sticking layer prior to depositing said conductive layer, and
   tailoring at least portions of said surface of said conductive layer, following said depositing, in a plasma to at least smooth said surface of said conductive layer, wherein said plasma is operated at a higher pressure and lower power than sputtering and at a lower pressure and higher power than ashing.

13. The method of claim 12 wherein cleaning is performed with an oxygen plasma to remove organic contaminants.

14. The method of claim 12 wherein said pre-sputtering is performed under conditions to further clean said surface and remove environmental contaminants.

15. The method of claim 12 wherein said depositing of said conductive layer is performed to a thickness of 50 to 5,000 Å.

16. The method of claim 12 wherein said tailoring is performed in a plasma to accomplish at least one of the following: (a) rearrange said conductive layer, (b) smooth said top surface of said conductive layer, (c) alter the hydrophilicity of said top layer, and (d) provide a barrier layer due to the presence of an oxide film on said top surface.

17. The method of claim 16 wherein said plasma is selected from the group consisting of oxygen alone to provide a hydrophilic surface, oxygen and subsequent argon to provide a less hydrophilic, more hydrophobic surface, argon alone to provide a hydrophobic surface, or a sequence of oxygen and hydrogen to provide a smooth surface with reduced oxygen, which is passivated.

18. The method of claim 17 wherein said plasma contains oxygen, leaving an oxide film on said conductive layer, and wherein said oxide film is subsequently removed, leaving said smooth top surface of said conductive layer.

19. The method of claim 12 wherein said tailoring includes at least one of the following steps: cleaning and oxidizing to a predetermined level.

20. The method of claim 12 wherein said tailoring includes at least one of the following steps: actively smoothing, actively oxidizing, actively removing said oxide without re-roughening, and actively passivating.

21. The method of claim 12 wherein said conductive material comprises a material selected from Rows 1B–7B and 8 of the Periodic Table.

22. The method of claim 21 wherein said conductive material is selected from the group consisting of platinum, tungsten, silver, aluminum, palladium, copper, nickel, chromium, molybdenum, titanium, and tantalum.

23. The method of claim 22 wherein said conductive material consists essentially of platinum.

24. The method of claim 12 wherein said second surface roughness is less than 8 Å RMS.

25. The method of claim 24 wherein said second surface roughness is approximately 4 Å RMS.

* * * * *

UNITED STATES PATENT AND TRADEMARK OFFICE
CERTIFICATE OF CORRECTION

PATENT NO. : 6,855,647 B2
DATED : February 15, 2005
INVENTOR(S) : Patricia A. Beck et al.

It is certified that error appears in the above-identified patent and that said Letters Patent is hereby corrected as shown below:

Column 15,
Line 25, after "lower" insert -- pressure --.
Line 64, delete "proximately" and insert in place thereof -- is approximately --.

Signed and Sealed this

Tenth Day of May, 2005

JON W. DUDAS
*Director of the United States Patent and Trademark Office*